United States Patent [19]

Lou et al.

[11] Patent Number: 5,220,570
[45] Date of Patent: Jun. 15, 1993

[54] PROGRAMMABLE VITERBI SIGNAL PROCESSOR

[75] Inventors: Huiling Lou, Stanford; John M. Cioffi, Cupertino, both of Calif.

[73] Assignee: The Board of Trustees of the Leland Stanford Junior University, Stanford, Calif.

[21] Appl. No.: 621,460

[22] Filed: Nov. 30, 1990

[51] Int. Cl.[5] .................. H03M 13/00; H03M 13/12; H03M 7/28
[52] U.S. Cl. ........................................ 371/43; 341/78; 341/94; 341/107
[58] Field of Search .................. 371/43, 44, 45, 46; 341/107, 94, 79, 78

[56] References Cited

PUBLICATIONS

Clark, G. et al., *Error-Correction Coding for Digital Communications*, Plenum Press, New York, 1981, pp. 254–264.

Gulak, P. et al., "VLSI Structures for Viterbi Receivers: Part I-General Theory and Applications", *IEEE Journal on Selected Areas in Communications*, vol. SAC-4, No. 1, Jan. 1986, pp. 142–154.

Frenet, N. et al., "Implementation of a Viterbi Processor for a Digital Communications System with a Time-Dispersive Channel", *IEEE Journal on Selected Areas in Communications*, vol. SAC-4, No. 1, Jan. 1986, pp. 160–167.

Fettweis, G. et al., "A 100 MBit/S Viterbi Decoder Chip: Novel Architecture and Its Realization", 1990 *Int'l Conference on Communications*, Apr. 1990, Paper No. 307.4.

*Primary Examiner*—Stephen M. Baker
*Attorney, Agent, or Firm*—Townsend and Townsend Khourie and Crew

[57] ABSTRACT

A signal processor which is specially adapted for decoding sequential codes, including trellis codes, convolutional codes and detecting signals in partial response channels. The processor has three units, a branch metric generator unit, an add-compare-select unit and a survivor-trace and decoding unit, each of which is independently programmable. A central control unit synchronizes operations between the units at the received symbol rate. Between synchronizations, each of the units operate concurrently and independently of the others.

3 Claims, 9 Drawing Sheets

VITERBI SIGNAL PROCESSOR ARCHITECTURE

VITERBI SIGNAL PROCESSOR ARCHITECTURE

ADD-COMPARE-SELECT UNIT

FIG. 3

FIG. 4 SURVIVOR-TRACE AND DECODING UNIT

| NO. | OPCODE | OPERANDS | OPERATIONS |
|---|---|---|---|
| 1. | ldR | addr | addr→addr counter R (51)(default is 0) |
| 2. | ldM | addr,A(or B or C) | addr→addr counter M5(or 6 or 3)(52)(default is 0) |
| 3. | ldA(orB) | Ry, (d)rx | m1[rx+d]→Ry<br>m2[rx+d] − d→M5(or 6) [addr counter M5(or 6) (52A(or B)]<br>addr counter M5(or 6) + 1→addr counter M5(or 6) |
| 4. | ldA(orB) | Rx, −rx | m1[−rx]→Rx<br>m2[−rx]→M5(or 6)[addr counter M5(or 6) (52A(or B))]<br>addr counter M5(or 6) + 1→addr counter M5(or6) |
| 5. | ldA(orB) | (d)rx | m1[rx+d]→FF(54A)<br>m2[rx+d] − d→M5(or 6)[addr counter M5(or 6) (52A(or B))]<br>addr counter M5(or 6) + 1→addr counter M5(or 6) |
| 6. | ld | (d)tx | m1[tx+d]→FF(54A)<br>m2[tx+d] − d→E[addr counter E (50)]<br>addr counter E + 1→addr counter E |
| 7. | ldaddA(orB) | Rx, (d)rx | m1[rx+d] + FF(54A)→Rx<br>m2[rx+d]−d→M5(or 6)[addr counter M5(or 6) (52A(or B)]<br>addr counter M5(or 6) + 1→addr counter M5(or 6) |
| 8. | ldaddA(orB) | Rx, (d)tx | m1[tx+d] + FF(54A)→Rx<br>m2[tx+d] − d→M5(or 6)[addr counter M5(or 6) 52A(or B))]<br>addr counter M5(or 6) + 1→addr counter M5(or 6) |
| 9. | add | Ry, Rz | Ry + Rz→R[addr counter R (51)]<br>addr counter R + 1→addr counter R (51) |

FIG. 5A

| | | | |
|---|---|---|---|
| 10. | rcc | r1, r2 | r1 + r2 → t1<br>-r1 + r2 → t2 |
| 11. | rc | r1, r2 | r1 - r2 → t1<br>r1 + r2 → t2 |
| 12. | rccst | E1, E2 | E1 + E2 → M5[addr counter M5 (52A)]<br>-E1 + E2 → M6[addr counter M6 (52B)]<br>addr counter M5 + 1 → addr counter M5<br>addr counter M6 + 1 → addr counter M6 |
| 13. | rcst | E1, E2 | E1 - E2 → M5[addr counter M5 (52A)]<br>E1 + E2 → M6[addr counter M6 (52B)]<br>addr counter M5 + 1 → addr counter M5<br>addr counter M6 + 1 → addr counter M6 |
| 14. | acsld | Rx, Ry, label | Rx + Ry → FF (57A)<br>label → FF (57B) |
| 15. | acs | Rx, Ry, label | if ((Rx + Ry) - mbus << 0), then<br>{(Rx+Ry) → FF (57A) and<br>label → FF (57B)} |
| 16. | acsst | Rx, Ry, label | if ((Rx + Ry) - mbus << 0), then<br>{(Rx+Ry) → R[addr counter R (51)]<br>label → M3[addr counter M3(52C)]}<br>else, {mbus → R[addr counter R (51)]<br>FF(57B) → M3[addr counter M3(52C)]}<br>addr counter R + 1 → addr counter R (51)<br>addr counter M3 + 1 → addr counter M3 (52C) |

*FIG. 5B* INSTRUCTION SET FOR THE BRANCH METRIC GENERATOR (BMG)

| NO. | OPCODE | OPERANDS | OPERATIONS |
|---|---|---|---|
| 1. | ldP | addr | addr ⟶ addr counter P (43A)(default is 0) |
| 2. | acsld | Rx, Py, label | Rx and Py ⟶ FF (59A)<br>y ⟶ FF (59B)<br>label ⟶ FF (59C) |
| 3. | acs | Rx, Py, label | if(Rx + Py − c − d) << 0), then<br>{(Rx and Py) ⟶ FF (59A) and<br>y ⟶ FF (59B)<br>label ⟶ FF (59C)}<br>else, do nothing |
| 4. | acsst | Ry, Py, label | if(Rx + Py − c − d) << 0), then<br>{(Rx + Py) ⟶ P[addr counter P(43A)]<br>y ⟶ M1[BC(53) concatenated with OC(54)]<br>label ⟶ M2[BC(53) concatenated with OC(54)]}<br>else, {(c + d) ⟶ P[addr counter P(43A)]<br>FF(59B) ⟶ M1[BC(53) concatenated with OC(54)]<br>FF(59C) ⟶ M2[BC(53) concatenated with OC(54)]}<br>addr counter P + 1 ⟶ addr counter P(43A) |

INSTRUCTION SET FOR THE ADD–COMPARE–SELECT (ACS) UNIT

*FIG. 6*

| NO. | OPCODE | OPERANDS | OPERATIONS |
|---|---|---|---|
| 1. | ldB | addr | addr → block counter B (default is [register B0]) |
| 2. | ldL | offset | offset → offset register L (default is 0) |
| 3. | ld1 |  | M1[MAR1] → MAR2, offset register L, ALU |
|  | ld1 | Sx | M1[MAR1] → MAR2, offset register L, ALu and Sx |
| 4. | ld2 |  | M2[MAR2] → MAR3 and MAR4 |
|  | ld2 | Sx | M2[MAR1] → MAR3, MAR4 and Sx |
| 5. | ld3 |  | M3[MAR3] → MAR4 |
|  | ld3 | Sx | M3[MAR3] → MAR4 and Sx |
|  | ld3 | M5 | M3[MAR3] → MAR4 and MAR5 |
| 6. | ld4 |  | M4[MAR4] → MAR5 and MAR6 |
|  | ld4 | Sx | M4[MAR4] → Sx and MAR6 |
| 7. | ld5 |  | M5[MAR5] → MAR7 |
|  | ld5 | Sx | M5[MAR5] → MAR7 and Sx |
| 8. | ld6 |  | M6[MAR6] → MAR8 |
|  | ld6 | Sx | M6[MAR6] → MAR8 and Sx |
| 9. | ld7 | Sx | M7[MAR7] → Sx |
| 10. | ld8 | Sx | M8[MAR8] → Sx |
| 11. | add | Sx,Sy | Sx + Sy → Sx |
| 12. | cmp | Sx,Sy | Sx - Sy → set control flags |
| 13. | and | Sx,Sy | Sx AND Sy → Sx |
| 14. | or | Sx,Sy | Sx OR Sy → Sx |
| 15. | xor | Sx,Sy | Sx XOR Sy → Sx |
| 16. | lls | Sx | Logical left shift of Sx → Sx |
| 17. | lrs | Sx | Logical right shift of Sx → Sx |
| 18. | als | Sx | arithmetic left shift of Sx → Sx |
| 19. | ars | Sx | arithmetic right shift of Sx → Sx |
| 20. | test | flag, label | if(control flag) goto label |

INSTRUCTION SET FOR THE SURVIVOR-TRACE AND DECODING (STD) UNIT

FIG. 7

TRELLIS FOR 4-STATE ENCODER EXAMPLE

FIG. 8A

| $V_2V_1$ | $U_{n-2}U_{n-1}U_n$ |
|---|---|
| 0 0 | 0 0 0 |
| 1 1 | 0 0 1 |
| 1 0 | 0 1 0 |
| 0 1 | 0 1 1 |
| 1 1 | 1 0 0 |
| 0 0 | 1 0 1 |
| 0 1 | 1 1 0 |
| 1 0 | 1 1 1 |

STATE TRANSITION DIAGRAM FOR 4-STATE ENCODER EXAMPLE

FIG. 8B

PROGRAMMABLE VITERBI SIGNAL PROCESSOR

BACKGROUND OF THE INVENTION

The present invention relates to a signal processor for decoding and/or encoding digital communication signals and, more particularly, to a programmable signal processor which efficiently decodes sequential codes by the Viterbi algorithm.

Over the past few decades, electronic communications have been increasingly implemented by digital signals. To preserve the integrity of the communication channels, various forms of coding have been studied. One generalized and useful type of coding is sequential coding including trellis codes, convolutional codes, partial response coded data channels and some compression methods. Sequential decoders for codes and channels with memory have been studied for many years, and many dedicated high speed architectures for such decoders have been created for specific codes.

However, the programming of the Viterbi and other sequential decoding algorithms on general purpose computers or digital signal processors is highly inefficient for almost all trellis codes, convolutional codes and partial response coded data channels. Though apparently straight-forward, the programming of the Viterbi and other sequential decoding algorithms is not readily executable. The large amounts of memory access operations and calculations to find the survivor trace render the implementation of these algorithms inefficient in general purpose computers having the standard arithmetic-logic-unit architecture.

With the increasing use of digital communications there has been a growing interest in the application of sequential decoding to various fields, including digital subscriber lines, voiceband modems, digital mobile radio, digital satellite transmissions, and speech and audio compression.

Thus there is an increasing need for a signal processor which may be used in a wide range of applications. Such a signal processor should be able to handle the different sequential codes in the various applications in contrast to the specialized processor architectures that have been created for specific codes. The present invention addresses this need and provides for a programmable signal processor which decodes various sequential codes in a highly efficient manner.

SUMMARY OF THE INVENTION

The present invention provides for a signal processor which is specially adapted for decoding sequential codes, including trellis codes, convolutional codes and detecting signals in partial response channels. The processor has three units, a branch metric generator unit, an add-compare-select unit and a survivor-trace and decoding unit, each of which is independently programmable. A central control unit synchronizes operations between the units at the received symbol rate. Between synchronizations, each of the units operates concurrently and independently of the others.

Special memory organizations permit each of the units, each a subprocessor, to access memory locations quickly in operation and easily from the user's programming standpoint. Furthermore, the partial tables are used with adder and logic functions so that all branch metrics for an application may be accessed with reduced memory requirements.

DETAILED DESCRIPTION OF SPECIFIC EMBODIMENTS

In accordance with the present invention, the Viterbi algorithm is implemented in the architecture of a signal processor for the efficient decoding of convolutional codes, trellis codes and partial-response coded data channels. The Viterbi algorithm is the maximum likelihood solution to the problem of estimating the original uncoded input sequence, based on some received sequence of symbols indicative of the transitions of one state to another in the sequence, which symbols are corrupted by additive white Gaussian noise.

The algorithm has three major steps for decoding:

Step 1. For each symbol, i.e. transition code, in a received sequence of symbols, the branch metrics for all possible transitions to all states are generated. The branch metric of a given transition is the squared distance between the noisy received symbol, i.e., the received transition code, and a noiseless symbol, i.e., the ideal transition code.

Step 2. For all the incoming transitions to each state, add the branch metrics to their corresponding previous path metrics. The path with the minimum sum is selected to be the most likely incoming path for that state. This path is appended to the appropriate survivor path. The survivor path records the most likely incoming sequence for each state.

Step 3. The survivor path is traced backwards and the most likely symbol at that point is determined and decoded. The steps are repeated iteratively to find the input sequence to the original encoder.

The Overall System

Figure 1:
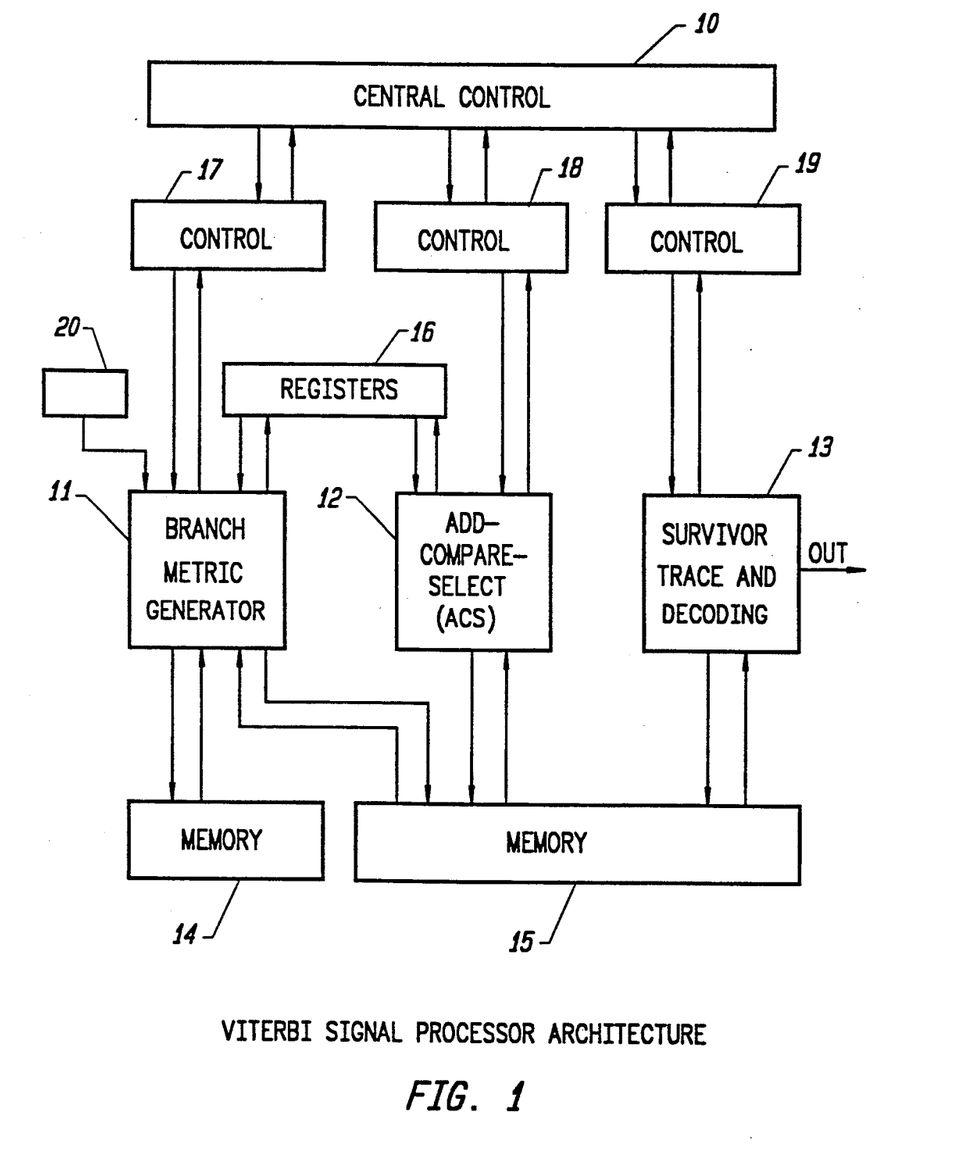
FIG. 1 is a diagrammatic view of the overall system according to the present invention.

To implement this algorithm, an architecture as illustrated in FIG. 1 is used. The signal processor of the present invention is divided into three parts, a branch metric generator (BMG) unit 11, an add-compare-select (ACS) unit 12, and a survivor-trace and decoding (STD) unit 13, under control of a central control unit 10. The BMG unit 11, the ACS unit 12, and the STD unit 13 act as three largely independent subprocessors. Each of these units 11, 12 and 13 have separate control units 17, 18 and 19, respectively, which are programmed independently for the user's contemplated application. The units 11, 12 and 13 also operate concurrently and independently of each other to a certain extent. They are synchronous with each other only at the symbol rate of the corresponding data transmission or compression coding system being implemented.

Operational speed of the system is greatly increased because of the special structure and instruction sets of these subprocessor units. These subprocessor units, which do not require multiplication functions, are implemented with a significantly shorter instruction-execution time than is possible with conventional digital signal processors.

The BMG unit 11 computes the branch metrics and transfers them in and out of the register file unit 16 which is also accessed by the ACS unit 12. The ACS unit 12 efficiently implements the add-compare-select computations prevalent in sequential decoding. The STD processor 13 performs the survivor tracing and symbol decoding functions.

The three subprocessor units, 11, 12, and 13 form the stages of a pipeline. At sampling time k, the BMG unit 11 computes the branch metrics from the received symbol at time k and stores these metrics in the register unit 16. At the same time, the ACS unit 12 determines the best incoming path for each state of the trellis given the branch metrics based on the received symbol at time $k-1$. The STD unit 13 traces the survivor path starting from the stage which corresponds to the sampling time $k-2$.

As stated above, all subprocessor units 11, 12 and 13 run concurrently and are controlled independently. This enables a programmer to code and test each unit 11, 12 and 13 separately. The control memory stores containing the programs for each of the units 11, 12 and 13 are respectively located in the control units 17, 18 and 19.

Within each subprocessor unit 11, 12 and 13, the instructions are executed in pipelined manner to ensure short overall instruction-execution times.

The central control unit 10 synchronizes the three units 11, 12 and 13 at the symbol rate. That is, each of the subprocessor units 11, 12 and 13 runs concurrently with the others. Having completed its operations, the unit then waits until the other two units 11, 12 and 13 have completed their operations on the current set of data before proceeding to the next set. Therefore, the sampling rate of the overall system is determined by the unit 11, 12 or 13 that requires the maximum execution time.

The memory of the signal processor is optimally arranged for high speed operation. The BMG unit 11 accesses a memory unit 14 which contains tables for the unit 11 to generate branch metrics. These generated branch metrics are stored in a register block 16 having branch metric register file and a path metric register file. These two files are accessed by the ACS unit 12 to find the optimum path into each state.

A memory unit 15 is divided into several parts, which are used by the STD unit 13 in tracing the survivor path. This memory division aids the user in the programming of the survivor-trace function.

Furthermore, by minimizing the memory requirements of the signal processor, it is possible to implement the processor on a single chip so that the processor may be readily adapted to a variety of applications, such as discussed above.

The Branch Metric Generator Unit

Figure 2:
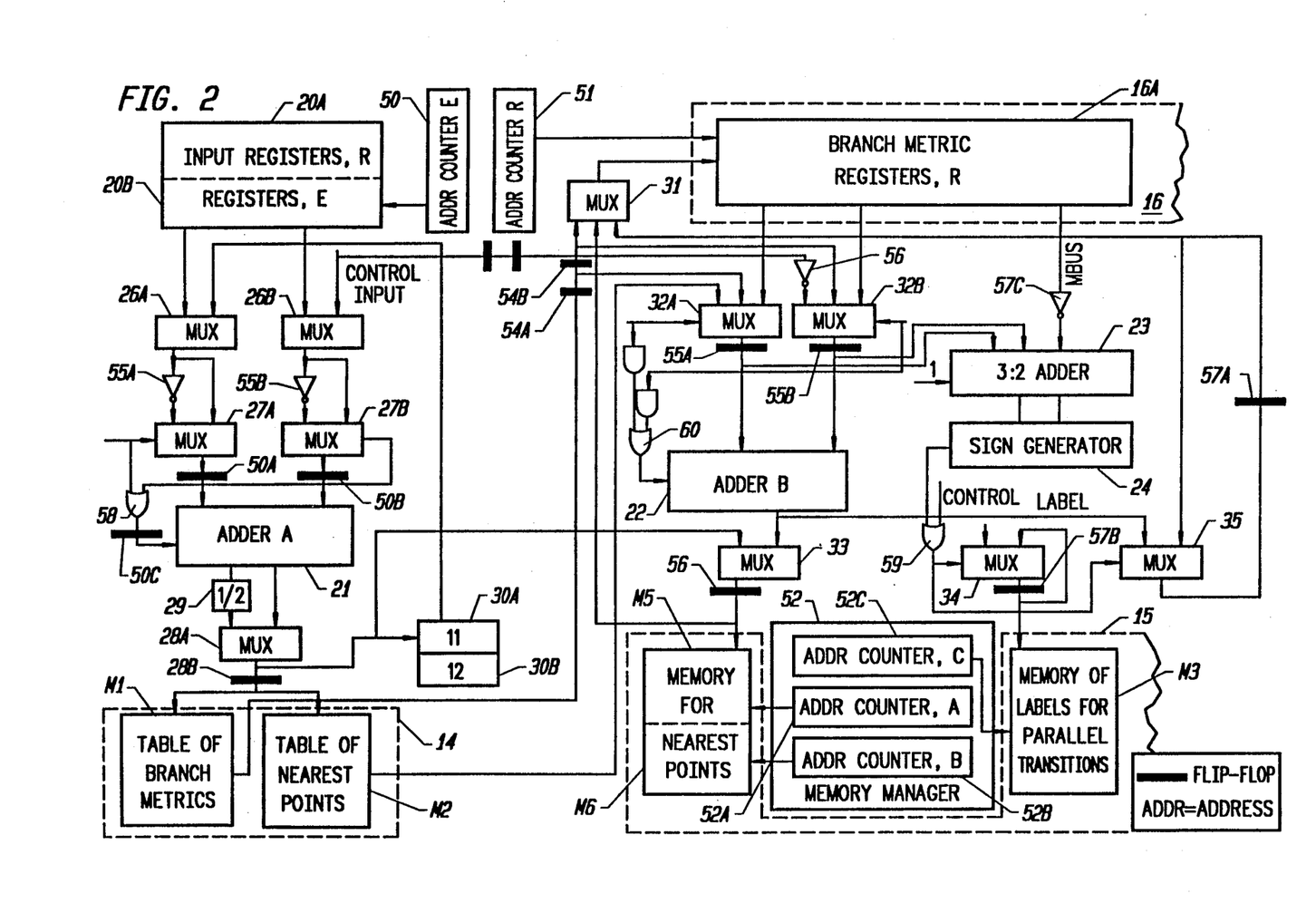
FIG. 2 is a block diagram of the branch metric generator unit of the present invention.

The branch metric generator unit 11 of FIG. 1 is shown in greater detail in FIG. 2. Each received symbol is stored in a register in a input register file 20 having several registers. The BMG unit 11 operates with a memory block 14 which has a table of branch metrics M1, a table of closest points M2, a memory of closest points M5 or M6, a memory of labels for parallel transitions M3 and a memory manager 52 for the memory of closest points M5 or M6 and memory of labels of parallel transitions M3.

The branch metrics for each particular application, i.e., code, are stored in the table M1. Ideally, the digital signals from the file 20A of a received symbol and the ideal symbol are used as the address to access the table M1 to obtain the branch metric. If the memory space required to store all the branch metrics between all possible received symbols and all ideal symbols in the selected code is small enough, then the table M1 can hold all the branch metrics in a straightforward manner. For an implementation of a Viterbi signal processor into a single integrated circuit as contemplated by the present invention, such is not the case typically.

In a typical application the table m1 stores only a portion of the branch metrics. With other function elements, such as adders and logic, in the BMG unit 11, the remaining portions of the branch metrics are readily calculated with programmed instructions from the control unit 17. The table m2, the two memory parts for closest points M5 or M6, the memory of labels for parallel transitions M3 and their manager 52 are used and adapted for decoding of multi-dimensional trellis codes and some convolutional codes.

For convolutional codes and partial response channels, the metric for each input bit is read from the table m1 and an adder 22 is used to add these metrics to form the branch metric of the whole input symbol.

For multi-dimensional trellis codes, the memory requirements to store the table of branch metrics can become quite large indeed. To save memory space, the branch metrics for the one-dimensional inputs are stored in table m1 and the higher dimensional cosets are built from these one-dimensional points. The adder 22 is used to add two one-dimensional metrics to form the branch metric of a two-dimensional symbol. The adder 22 is also used together with a 3:2 adder 23 to perform the ADD and add-compare-select (ACS) operations to generate the branch metrics for the higher dimensional cosets. These ACS operations are similar to those in the ACS unit 12. However, these operations are left in the BMG unit 11 to balance the computational load with the ACS unit 12.

Memory requirements may be further reduced if different cosets of a trellis code share the same table. For example, the same table may be used to look up the branch metrics of another coset by displacing the memory address to the table by a distance d. The adder 21 is used to displace the address to memory m1 and m2 by d, and the adder 22 is used to displace the nearest points read from the memory m2 by $-d$ before storing it to the memory M5 or M6.

Since the branch metric register file 16A is accessed by both the BMG and ACS units 11 and 12, the register file 16A is divided into two banks. The two units 11 and 12 access registers in each bank alternately. This eliminates the requirement that the user make sure that the two units 11 and 12 do not read from and write to the same register.

The Add-Compare-Select Unit

Figure 3:
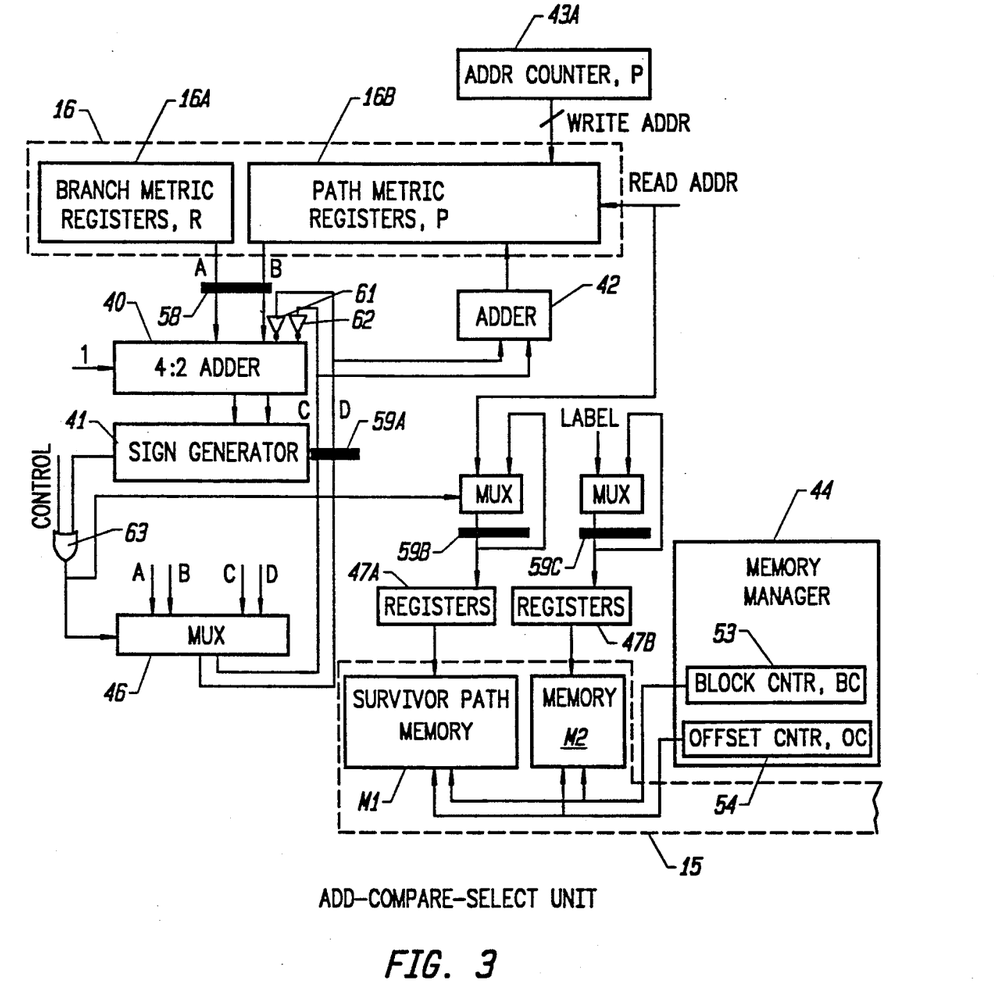
FIG. 3 is a block diagram of the add-compare-select unit of the present invention.

A more detailed block diagram of the add-compare-select unit 12 in FIG. 1 is illustrated in FIG. 3. The unit 12 finds the most likely incoming path for each state by comparing the sums of the branch metrics and their corresponding path metrics, and selecting the path with the minimum sum as the most likely path.

The branch metric and its corresponding path metric are sent to a 4:2 adder 40 to be compared with the minimum sum. During the search operation for the minimum sum, the minimum is stored in a carry-save form to enable fast comparison. At the end of the search, the minimum is converted back into a single number and stored in a path metric register file 16B. This allows the user to deal with conventional numbers and saves the number of registers required to store the path metrics. A sign generator 41 uses the carry-select algorithm for a fast carry generation in order to determine the sign of the sum.

A memory manager 44 stores the pointer to the resulting survivor path into a survivor path memory M1. The manager 44 runs in parallel with the rest of the ACS unit 12.

The ACS unit 12 executes two classes of instructions: ACS and memory referencing. With ACS instructions, the program determines the most likely incoming path to each state, i.e., the path with the minimum metric. Then the pointer to this most likely path is stored into the survivor path memory M1 by memory referencing instructions. The pointer can be a previous state number or a ideal transition output.

The operands for the ACS instructions, the branch metrics and path metrics, are stored in the register files 16A and 16B respectively. As in the case for the branch metric register file 16A, the path metric register file 16B is divided into two banks of registers, one for storing the previous path metrics and the other for the updated path metrics.

The Survivor-Trace and Decoding Unit

Figure 4:
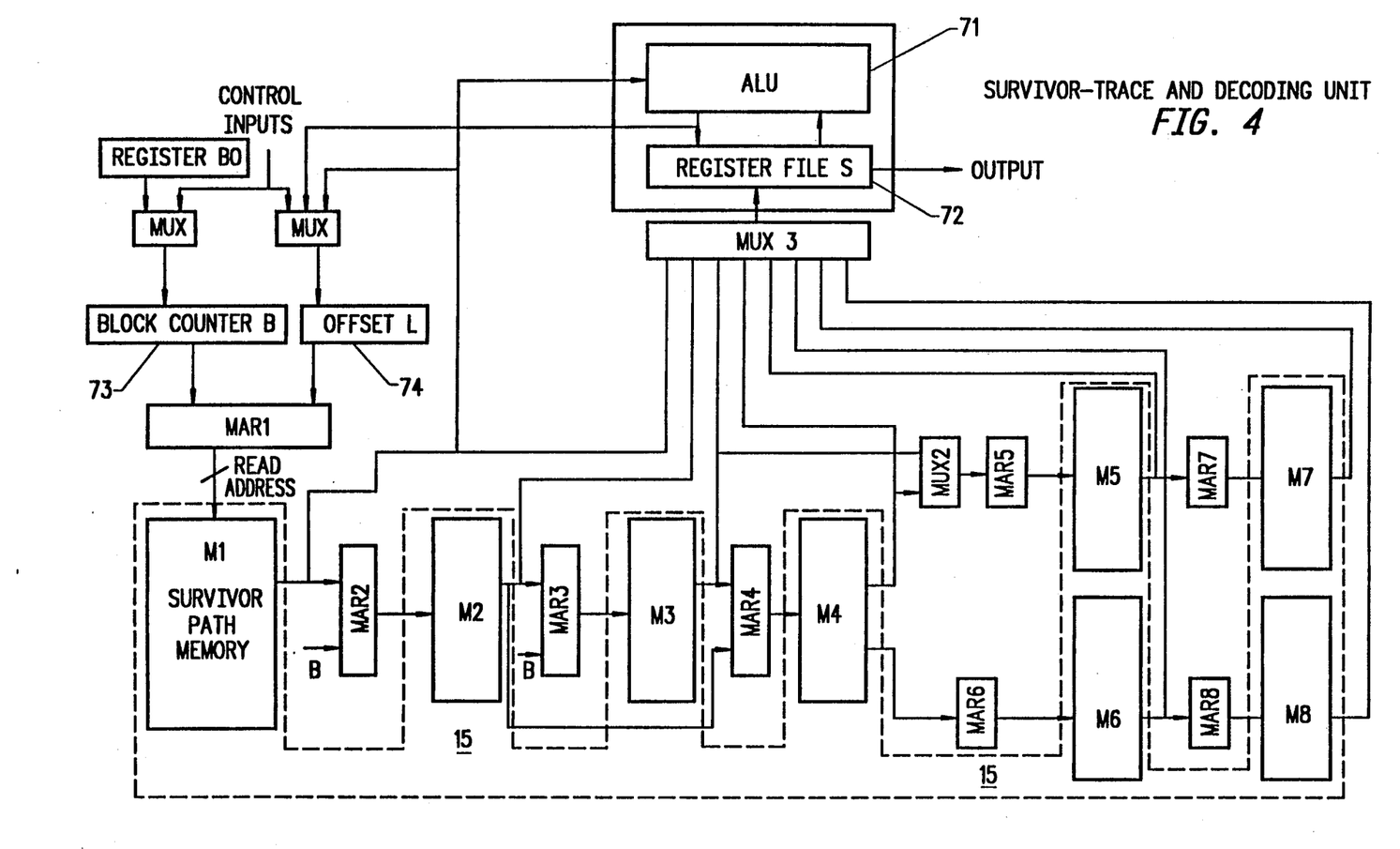
FIG. 4 is a block diagram of the survivor-trace and decoding unit of the present invention.

The survivor-trace and decoding unit 13 of FIG. 1 is illustrated in greater detail in FIG. 4. The STD unit 13 traces the survivor path and finds a most likely symbol. The survivor path memory M1 is divided into several blocks. Each block corresponds to one stage of the trellis or equivalently one symbol period. Each block contains pointers to the survivor paths for all states. The pointers are implemented as offsets within a block. To trace one step of the survivor path, the block counter is decremented and concatenated with the offset within the block to form the address of the memory location that contains the offset within the next block. When the block counter overflows, the overflow bit is ignored to ensure automatic wraparound. An ALU 71 decodes the most likely symbol before transmitting the data out as output.

The STD unit 13 has memory referencing instructions to trace the survivor path. One instruction traces one stage, i.e., one symbol period, of the trellis backwards. Each instruction decrements the block counter 73, concatenates it with the offset counter 74 to form the memory address, and then reads the contents of the addressed memory M1 to M8 depending upon the specific instruction. The trace of the optimum path, the path with the smallest metric, yields the most likely symbol. Logic operations, such as EXCLUSIVE-OR, are used to decode and find the most likely input sequence to the encoder.

The counter 73 is used so that the block pointer wraps around when the limit of the survivor path memory is reached. If the length of the survivor is L, there should be at least L+1 blocks in the survivor path memory so that the ACS unit 12 does not overwrite the data before the STD unit 13 reads the data. The ACS unit 12 operates in a first-in, first-out manner to continuously overwrite the oldest block of data in the survivor path memory. The decoder block counter 73, on the other hand, starts tracing the survivor from this same block of most recently stored data at the next period, but in the opposite direction from the ACS unit 12.

Instruction Set for the Branch Metric Generator (BMG) Unit

Figure 5A:
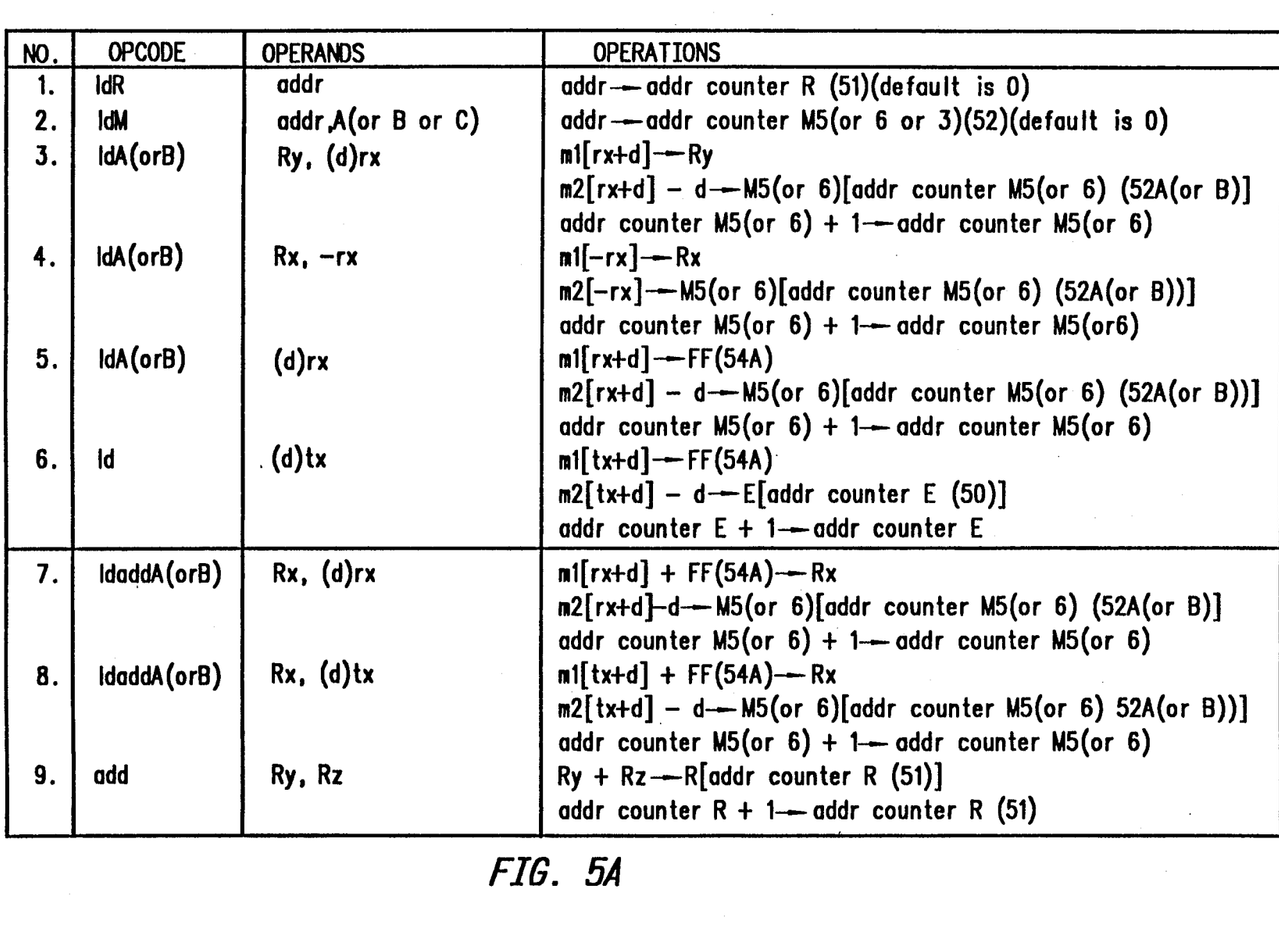
FIGS. 5A and 5B are a table of instructions for the branch metric generator unit.
Figure 5B:
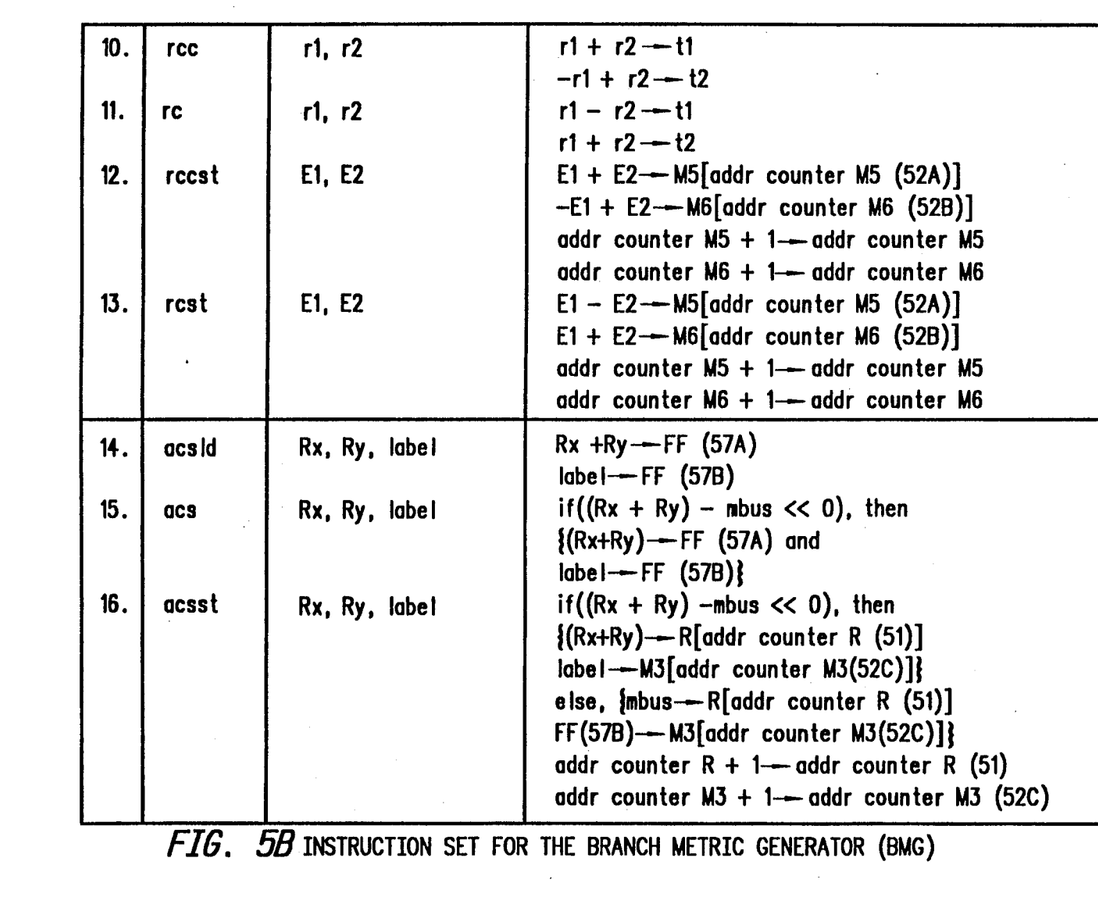

A set of the instructions for the architecture in FIG. 2 is listed in FIG. 5. Rx represents a register location in the branch metric register file 16A, while rx represents a location in the input register file 20A. The symbol m1[xxx] means contents of the location pointed by xxx in m1.

In order to minimize the instruction word size, many instructions use implied return memory or register locations. The load instructions (ldR and ldM) initialize the starting locations of the implied addresses. Other load instructions (ld) are used to read the metric and the nearest points from the memories m1 and m2. These instructions can shift the register contents by an offset of d or negate the register contents before accessing the memories m1 and m2. Ldadd instructions add the two branch metrics for each dimension directly to form the branch metric for a two-dimensional symbol.

Rotation instructions are used, for example, for different cosets of the trellis codes with depth 1 and 3 to generate the branch metrics one dimension at a time from the branch metrics table. For all the rotation operations, the first operand stores the value in the x-axis and the second operand stores the value in the y-axis. The instruction rcc rotates the two points given in the operands by 45° in the counter-clockwise direction and multiplies the rotated points by $\sqrt{2}$. That is, if the two operands are r1 and r2, the operations $$t1 = r1 + r2$$

$$t2 = -r1 + r2$$

are performed. The instruction rc is used to rotate the operands by 45° in the clockwise direction and multiply the rotated points by $\sqrt{2}$. Thus, the operations, $$t1 = r1 - r2$$

$$t2 = r1 + r2$$

The instructions rccst and rcst perform the same rotation operations as the rcc and rc respectively. However, the rotated points are divided by $\sqrt{2}$, rather than multiplied by $\sqrt{2}$, and they are also stored into memory M5 and M6.

When there are multiple transitions (or parallel transitions) from one state to another state, the ACS instructions are used to find the transition within the parallel transitions that has the minimum metric. This metric is the branch metric of that path.

Instruction Set for the Add-Compare-Select (ACS) unit

Figure 6:
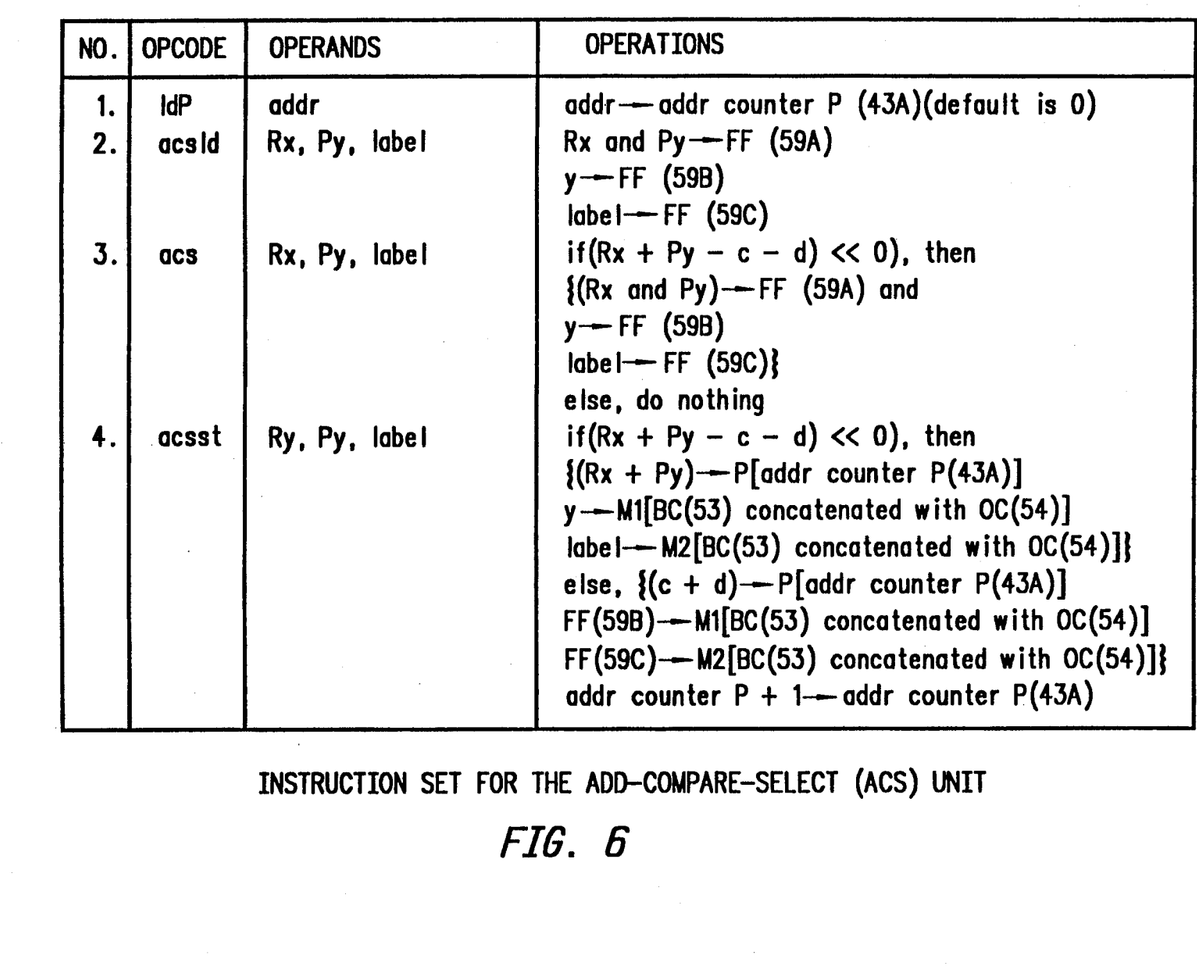
FIG. 6 is a table of instructions for the add-compare-select unit.

The instruction set for the ACS unit in FIG. 3 is listed in FIG. 6. In the table, Rx represents the register location x in the branch metric register file 16A, while Px represents the register location x in the path metric register 16B.

Similar to the BMG units, some instructions in the ACS unit use implied return memory or register locations. The instruction ldP initializes the implied return register location in the path metric register file 16B. The ACS control unit increments the block counter 53 by 1 and resets the offset counter 54 to zero after every symbol period. Rx represents the register location x in the branch metric register file 16A, while Px represents the register location x in the path metric register 16B.

Instruction Set for the Survivor-Trace and Decoding (STD) Unit

Figure 7:
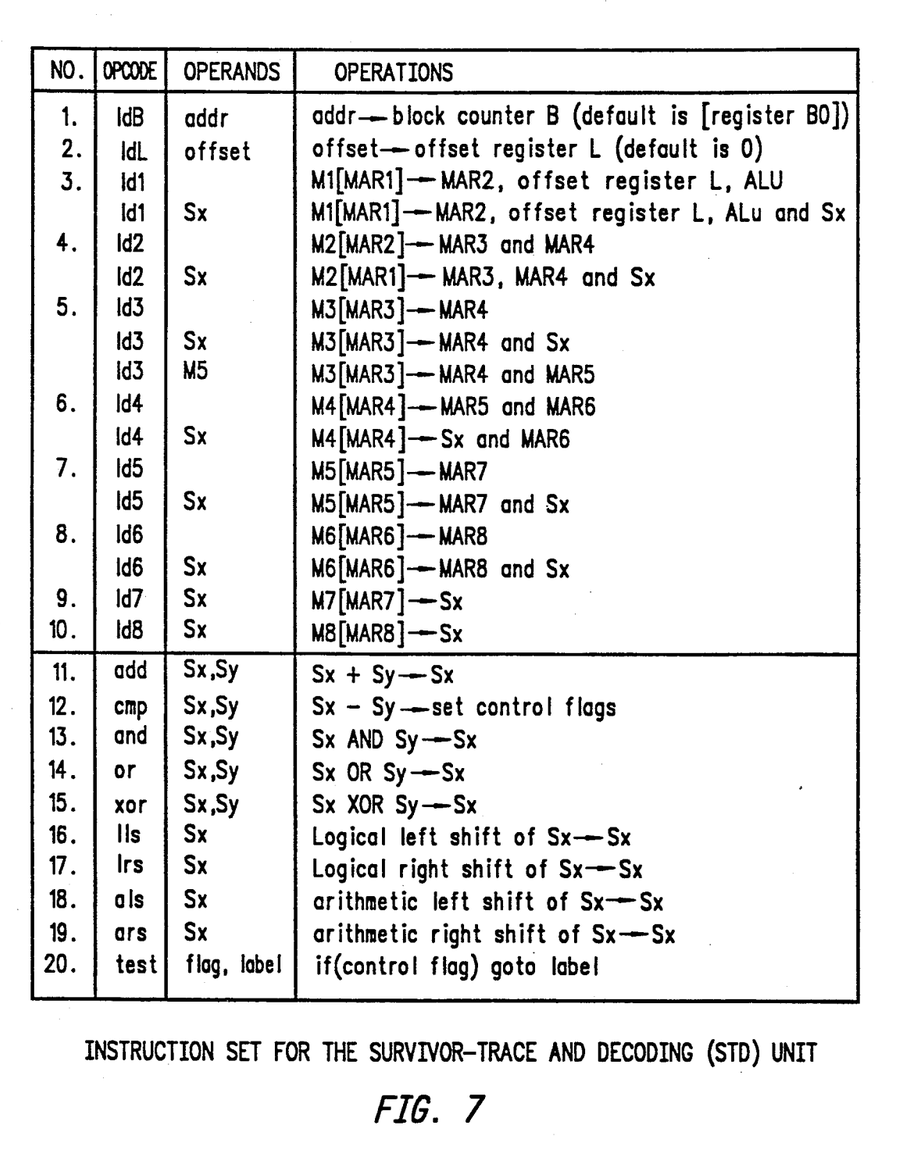
FIG. 7 is a table of instructions for the survivor trace and decode unit.

The instruction set based on the architecture of the STD unit shown in FIG. 4 is listed in FIG. 7. Note that the standard I/O instructions are not listed here. The STD consists of memory referencing operations and the basic logic operations in the ALU (see FIG. 4). The memory referencing operations are used to trace the optimal path and the logic operations are used for decoding the symbol into bits.

Mx[MARx] means contents in location MARx (memory address register x) in memory Mx 15. Sx represents the register location x in the register file 72.

An Example of Decoding Program For a Convolutional Code

Figure 8A:
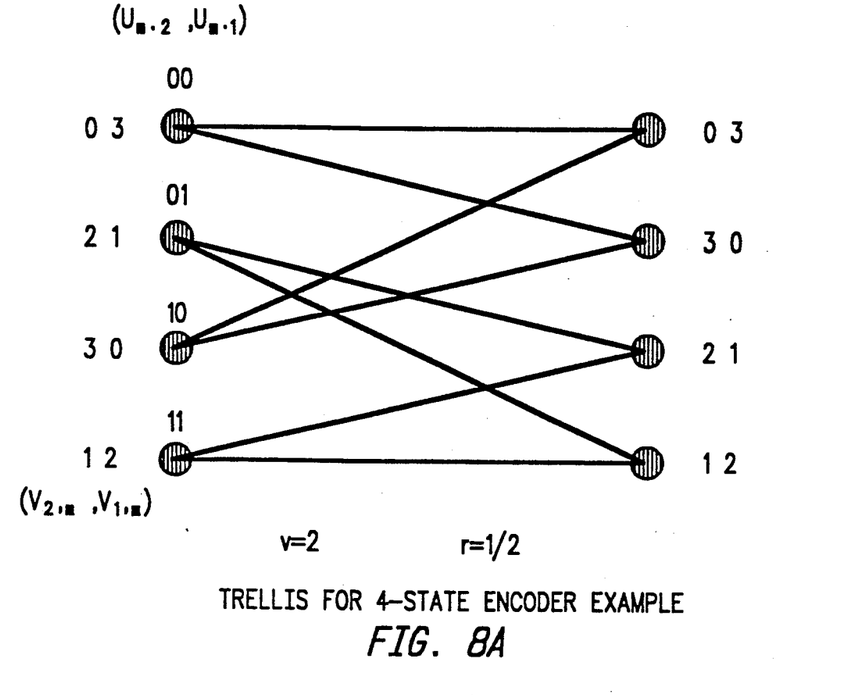
FIG. 8A illustrates a trellis for an example of decoding.
Figure 8B:
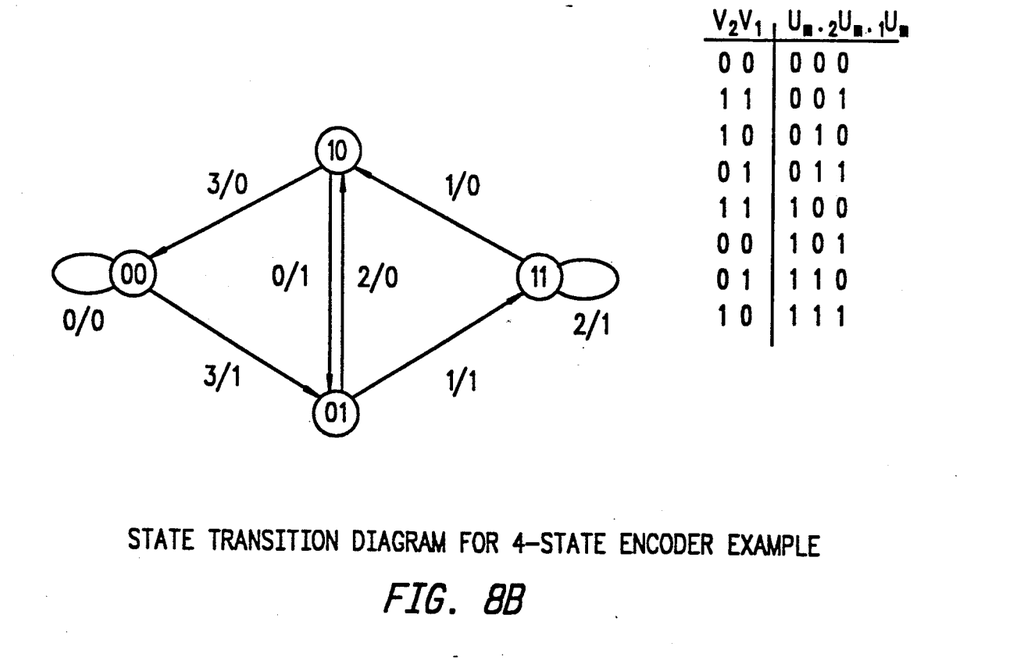
FIG. 8B shows the state transition diagram for the same example as FIG. 8A.

An example of how the signal processor above could be programmed may be beneficial in understanding the operations of the signal processor. In this example a convolutional code without parallel transitions (4-state rate ½) is used. The trellis for the code is shown in FIG. 8A; the state diagram for the code is shown in FIG. 8B. The received inputs bits are stored in registers r0 and r1.

In this example, there is assumed to be only one table of metrics listed for ideal transition output=0. Therefore, the input bit must be flipped about the y-axis in order to use the same table to look-up the metric for ideal output transition −1.

| For the BMG Subprocessor Unit: | |
|---|---|
| first bit: | |
| ld R0, r0 | /* read metric for transition output = 0 */ |
| ld R1, −r0 | /* read metric for transition output = 1 */ |
| second bit: | |
| ld R2, r1 | |
| ld R3, −r1 | |
| Calculate branch metrics: | |
| add R0, R2 | /* metric for output transition=00 stored in R0 of the second register file */ |
| add R0, R3 | /* metric for output transition=01 stored in R1 of the second input register file */ |
| add R1, R2 | /* metric for output transition=10 stored in R2 of the second register file */ |
| add R1, R3 | /* metric for output transition=11 stored in R3 of the second register file */ |
| For the ACS Subprocessor Unit: | |
| State 0: | |
| acsld R0, p0, 0 | /* initialize the branch metric for 00 and the path metric, stored in p0, for state 0 as the minimum. Also initialize the MUX 59B as 0 (implied from p0) and the MUX 59C as 0, the input of this transition */ |
| acsst R3, p2, 0 | /* compare (contents of R3 + contents of P2) with the minimum. If sum is smaller than the minimum, compute the sum and stored in p0 of the second path metric register file. The pointer to survivor path, 2, and the input of the transition, 0, are stored in M1 and M2 respectively */ |
| State 1: | |
| acsld R3, p0, 1 | |
| acsst R0, p2, 1 | |
| State 2: | |
| acsld R2, p1, 0 | |
| acsst R1, p3, 0 | |
| State 3: | |
| acsld R1, p1, 1 | |
| acsst R2, p3, 1 | |
| For the STD Subprocessor Unit: | |
| M1 contains previous state numbers of the decoding path and M2 contains the input value associated with the states. | |
| ldB B0 | /* initilize the block counter 73 */ |
| ldL 0 | /* traceback from state 0 */ |
| ld1 | /* read the memory content from M1 */ |
| ld1 | /* assuming decoding length = 10. Thus repeat 9 times */ |
| ld1 | |
| ld1 | |
| ld1 | |
| ld1 | |
| ld1 | |
| ld1 | |
| ld1 | |
| ld2 S1 | /* read the input of the transition directly from memory and store in register S1 */ |

While the description above provides a full and complete disclosure of the preferred embodiments of the present invention, various modifications, alternate constructions and equivalents may be employed without departing from the true scope and spirit of the invention. For example, while a signal processor with three independently programmable subprocessor units has been described, signal processors of lesser programmability (and lesser flexibility) are possible. For a selected set of convolutional codes the BMG unit may be hardwired, and the ACS and STD units left programmable for the particular code desired. Another variation is to use the transition probabilities as the branch metrics, and to select the maximum sum of the branch metrics and its previous path metric to determine the most likely path.

Thus the present invention teaches a signal processor for sequential codes which is suitable for high-speed operation, flexible for many decoding functions, and adaptable for implementation into a single chip. Therefore, the present invention should be limited only by the metes and bounds of the appended claims.

What is claimed is:

1. A signal processor for decoding sequential codes, said processor receiving a sequence of symbols reflecting transitions between sequential states, said sequence time-indexed by an integer k, said signal processor comprising a first unit having a first control unit with programmed instructions for generating control signals, said first unit receiving said symbol sequence for generating the branch metrics between each received symbol and the set of possible symbols for time k responsive to said programmed instructions in said first control unit;

a second unit having a second control unit with programmed instructions for generating control signals, said second unit coupled to said first unit for adding the branch metrics to the partial path metrics for each coded state, comparing the sums of the partial path metrics and the branch metrics for each coded state, and selecting the sum of the most likely path as the partial path metric for said coded state and appending said most likely path to the associated survivor path for each coded state for time k−1 responsive to said programmed instructions in said second control unit;

a third unit having a third control unit with programmed instructions for generating control signals, said third unit coupled to said second unit for determining the coded state having the lowest partial path metric and the survivor-trace and decoding said symbol for a preselected time before time k−2 responsive to said programmed instruction in said third control unit; and a central control unit coupled to said first unit, said second unit and said third unit for synchronizing operations between said units;

whereby said first unit, said second unit and said third unit operate concurrently and are independently programmable.

2. The signal processor as in claim 1 wherein said central control unit synchronizes said units at a rate of reception of said symbol sequence.

3. The signal processor as in claim 2 wherein each of said units operates independently until said central control unit synchronizes said units.

* * * * *